United States Patent [19]

Davis et al.

[11] 4,365,163

[45] Dec. 21, 1982

[54] PATTERN INSPECTION TOOL - METHOD AND APPARATUS

[75] Inventors: Donald E. Davis, Wappingers Falls; Richard D. Moore; Philip M. Ryan, both of Hopewell Junction; Edward V. Weber, Poughkeepsie, all of N.Y.

[73] Assignee: International Business Machines Corporation, Armonk, N.Y.

[21] Appl. No.: 218,323

[22] Filed: Dec. 19, 1980

[51] Int. Cl.³ .............................................. H01J 37/00
[52] U.S. Cl. ................................. 250/491.1; 250/492.2
[58] Field of Search ...................... 250/492.2, 398, 491

[56] References Cited

U.S. PATENT DOCUMENTS

| | | |
|---|---|---|
| 3,515,877 | 6/1970 | Baxter et al. |
| 3,523,495 | 8/1970 | Giedd et al. |
| 3,643,098 | 2/1972 | Willis |
| 3,783,228 | 1/1974 | Tarui et al. |
| 3,857,041 | 12/1974 | Spicer ............................ 250/492.2 |
| 3,908,118 | 9/1975 | Micka |
| 4,264,822 | 4/1981 | Ueno et al. ...................... 250/492.2 |
| 4,286,154 | 8/1981 | Okubo ............................ 250/492.2 |

FOREIGN PATENT DOCUMENTS 1328976  9/1973  United Kingdom ............. 250/492.2

OTHER PUBLICATIONS

"Automatic Pattern Positioning of Scanning Electron Beam Exposure", Miyauchi et al., *IEEE Trans. on Electron Devices*, vol. ED.-17, No. 6, Jun. 1970, pp. 450-457.
"Mask Inspection Using Electron-Beam Systems", Grobman, *IBM Tech. Disclosure Bulletin*, vol. 22, No. 12, May 1980, p. 5540.

*Primary Examiner*—Bruce C. Anderson
*Attorney, Agent, or Firm*—Francis J. Thornton

[57] ABSTRACT

This describes an automatic defect inspection system as could be applied to metallized masks or other patterns. The system causes each subfield to be individually aligned for inspection irrespective of the previous alignment of the pattern or any other sub-field. This is accomplished by scanning a preselected portion of each sub-field and adjusting the position of the scan based on the resulting signal while scanning a pre-established portion of the sub-field. In this way a portion of each sub-field is used as an alignment mark and stepping errors avoided.

Once alignment is achieved a probe, comparable to the size of the minimum defect to be detected is scanned over the sub-field with an overlapping pattern to find defects such as excessive metal, metal in improper places or points where the metal is missing.

13 Claims, 10 Drawing Figures

PATTERN INSPECTION TOOL - METHOD AND APPARATUS

FIELD OF THE INVENTION

This invention relates to a method and an apparatus for automatic inspection, testing, measurement, and verification of high contrast image patterns.

RELATED APPLICATION

A co-pending application entitled, Semiconductor Device Array Mask Inspection and Apparatus, Ser. No. 218,322 filed Dec. 19, 1980, is related to the subject matter of this application.

BACKGROUND OF THE INVENTION

The basic economic advantages that can be realized from automating mask alignment procedures in mask defect inspections have been projected many times in the past but technically and economically attractive solutions have not been set forth. In the prior art the positioning and inspection of such masks has generally been performed by individual operators at microscopes with the operators being trained to manually position the masks and to recognize and measure on a statistical sampling basis different types of geometrical defects in the mask. By using a statistical sampling method less than 100% inspection occurs. The inspection costs are maintained at a tolerable level but the yield of semiconductor devices exposed using such partially inspected masks may be severely reduced from what could be achieved.

Previous attempts to automate mask defect inspections have had limited success primarily because of the difficulty in avoiding erroneous defect indications caused by positional errors between the respective areas on the masks which occur due to stepping errors in the production equipment used to create the mask. Such prior inventions did not provide means for resolving this stepping error from defects or other variations in the masks, especially when multiple, complex mask geometries were to be aligned or inspected.

The present invention resolves or avoids these difficulties and is an automatic alignment and inspection system. This invention relies on the measurement of either transmitted or reflected light, reflected or secondary electrons, or back-scattered currents when a controllable beam is selectively addressed onto the unit being inspected with controlled field alignment and especially on specified utilitarian aspects of the mask which can be used as the alignment target for the controlled field alignment.

The present invention achieves a significant improvement over the prior art for it compares the measured data against the original design data thus obtaining an accuracy of approximately 100% with higher resolution geometries.

SUMMARY OF THE INVENTION

In the present invention the geometry of the mask is treated as if it, or a portion of it, were a machine detectable alignment mark so that after the mask, to be inspected, is mounted in a stepping fixture and grossly aligned by reference to a gross alignment mark, each selected field, sub-field or unit area of the mask can be precisely located with respect to an inspection position and measured regardless of variations between each field sub-field or unit area or any other previously aligned field sub-field or unit area or the gross alignment mark itself. The invention uses a portion of each pattern to be inspected as its own final precise alignment mark. This invention thus renders the system insensitive to stepping problems or errors in the making of the mask, and permits the measurement and inspection of complex arrays with fiducials and test sites as well as simple arrays with gross interconnection patterns.

The use of the invention achieves easy, inexpensive 100% inspections and permits handling high resolution geometries and produces higher yields due to the better accuracy of the inspection process than any known to the prior art.

Broadly speaking the invention comprises the steps of:

placing a patterened workpiece to be inspected in the inspection apparatus, then, after achieving a coarse registration of the workpiece to the inspecting beam by methods well-known in the prior art, directing the beam first over selected edges of a section (subfield) of the pattern to be inspected and deriving from the returned signal a more precise registration of the subfield to the beam, then directing the beam over all portions of the subfield from which one return signal level is expecting and recording the locations at which deviations occur, then directing the beam over all portions of the subfield from which a different return signal is expected and recording the locations at which deviations occur, and repeating the above three steps for all subfields until the entire area has been inspected.

Once this is complete the workpiece may be moved or the beam may be deflected to another portion of the field so that the beam can repeat the scanning and alignment steps above to align each region on said mark to said inspection position and inspect each said region. In this way the location of defects can be found and recorded at the same time that the pattern itself is verified.

The workpiece registration is done in several stages of increasingly precise resolution. In the final and most precise stage of registration, certain horizontal and vertical edges of the pattern are illuminated and the difference between the return signals is used to generate a translational correction in each axis to align the upcoming inspection scans to the area to be inspected.

The area to be inspected, which has just been precisely aligned relative to the inspection field, is illuminated by a sequence of rectangular spots. First a sequence of illuminating spots is directed to cover all areas in which one level of returned signal is expected, say the high level. If the returned signal falls below a certain threshold, the coordinates of the point being illuminated at the time of the deviation occurred are recorded, noting a substractive defect at that point. Then the sequence of illuminating spots is directed to cover all areas in which the other level of returned signal is expected, say the low level. If the returned signal rises above a certain threshold, the coordinates of the point being illuminated at the time of the deviation are recorded, noting an additive defect. Thus the entire sub-field, or most of it excluding a narrow band around all the edges, has been scanned by a sequence of illuminating spots, and the coordinates of any illuminated points returning an unexpected signal have been recorded.

The set of illuminating spots are of a size comparable to, but preferably ~2X larger than, the minimum area of the often irregularly shaped defects which are to trigger a fault indication. The illuminating spot should be as large as possible to:

Scan the inspected area quickly, with as few illuminating spots as possible, maximize the return signal so that differences between high and low returns are most easily distinguished, and assure that all unexpected returns from any single spot illumination identifies a defect of sufficient magnitude as to require rejection or repair of the workpiece being inspected.

The sequence of illuminating spots are overlapped, so that in the set of illuminating spots at least one inspecting spot will substantially coincide with the area of a defect, resulting in a large deviation from the expected signal level. The combination of relatively large illuminating spots and overlapping of the spots assures that;

an unexpected return signal from as few as one spot, signals a defect requiring action, and at least one illuminating spot will indeed substantially cover a minimum-size defect in the inspected area.

This allows the trigger threshold to be set at a level which will assure detection of all real defects and avoid false-alarms.

Since the normal high and low return signal levels will vary as a function of location, the trigger threshold(s) are automatically adjusted based on the average level of high and low return signals most recently measured.

DETAILED DESCRIPTION

Figure 1:
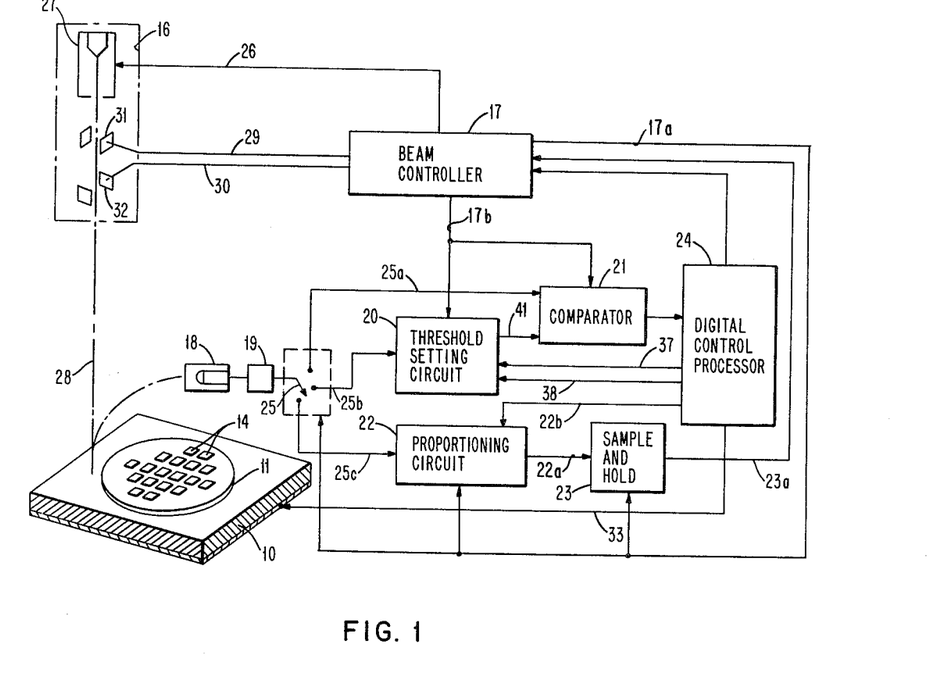
FIG. 1 shows in schematic form an apparatus embodying the present invention.
Figure 2:
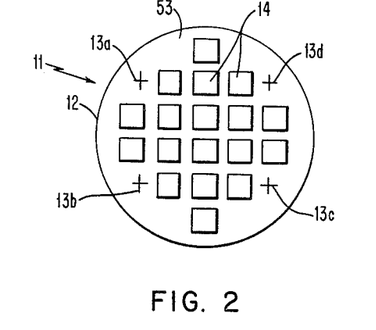
FIG. 2 illustrates an overall workpiece of the type to be inspected.

An illustrative arrangement of one of the possible methods and apparatus for positioning and inspecting workpieces in accordance with the teachings of the invention is shown in FIG. 1. Here a suitable XY positioning table 10 has a workpiece 11 to be inspected, placed thereon. This workpiece 11, shown in FIG. 2, generally comprises a substrate 12 having both gross alignment marks 13a, 13b, 13c and 13d each of which is in the form of crosses, chevrons or the like and a plurality of fields 14 thereon.

It should be clearly understood that many workpieces are known to the industry. For example, patterned substrates are used as chip carriers. Also, optically transmissive masks formed of glass with optically opaque materials such as metal or photoresist can be used. Also the masks could be comprised of material such as silicon which is transparent to infrared. For illustrative purposes only, in the present embodiment, it will be assumed that the substrate 12 is formed of glass and the patterns 15 are formed of thin metal films deposited on the glass.

Figure 3:
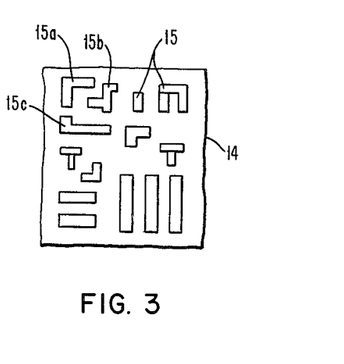
FIG. 3 illustrates a typical field of the workpiece being inspected.

Each field, as shown in FIG. 3, is comprised of a number of different geometric, metallized patterns 15 deposited on the substrate. Each field is usually, but not necessarily, identical to every other field. It should be understood that the present invention can inspect masks in which each field contains a pattern different from the patterns in every other field. Thus, each mask can have, thereon, a multiplicity of design patterns plus parameter control test patterns on the same mask. Such masks are common, well known and widely used in the semiconductor industry.

The positioning and testing apparatus of FIG. 1 comprises a controllable electron beam apparatus 16, a beam controller 17, an electron detector 18, an amplifier 19, a threshold setting circuit 20, a comparator circuit 21, a proportioning circuit 22, a sample and hold circuit 23, a digital control processor 24 and a switch 25 which serves to connect the detector 18 and amplifier 19 to either the comparator 21, the threshold setting circuit 20 or to the proportioning circuit 22. The setting of switch 25 is synchronized by the beam controller 17 via line 17a. The control processor 24, may include any suitable general purpose computer, such as a System 7 or Series 1 sold by the IBM Corporation. This processor contains all the necessary information and details pertaining to the mask to be inspected. It contains information as to all alignment marks as well as all information as to the detailed shape and position of the patterns 15. This processor also generates signals that drives the beam controller 17 which controls, via line 26, the electron beam source 27 to turn the electron beam 28 on and off. The controller 17 further controls, via lines 29 and 30, the beam deflection means 31 and 32 which control the position of the electron beam 28 on the mask, and synchronizes, via lines 17a and 17b, the operation of the threshold-setting circuit 20, the comparator 21, the proportioning circuit 22, the sample-and-hold circuit 23, and the switch 25. The processor 24 also controls via line 33 the position of the XY table 10.

The mask to be inspected is held on the XY positioning table 10 by suitable jigs or holding apparatus (not shown). In this described embodiment to assure that the electron beam does not charge either the material forming the patterns 15a, 15b, 15c, etc. or the substrate itself, while it scans these areas, a thin, grounded, conductive, transparent layer 53, indicated in FIG. 2, may be deposited over the substrate. It has been found that thin conductive materials, such as tin-oxide, are particularly suitable for this purpose. When the substrate is conductive or a semiconductor, layer 53 is not necessarily required. Also this layer 53 is not required if a non-charging beam such as light beam is used.

Initially the switch 25 is set to connect the detector 18 and amplifier 19 to the threshold setting circuit 20 via line 25b and the processor 24 set to cause the controller 17 to turn on beam 28. The beam 28 is caused to move such that the beam will scan or traverse the mask and fields 14. The impinging of the beam, on the glass of the substrate 12, and on the various patterns 15 deposited on the glass, causes both secondary electrons and back-scattered electrons to be emitted from the mask. Each of the materials, i.e. the glass, or the material of the patterns emits different levels of secondary electrons and back-scattered electrons.

Figure 5:
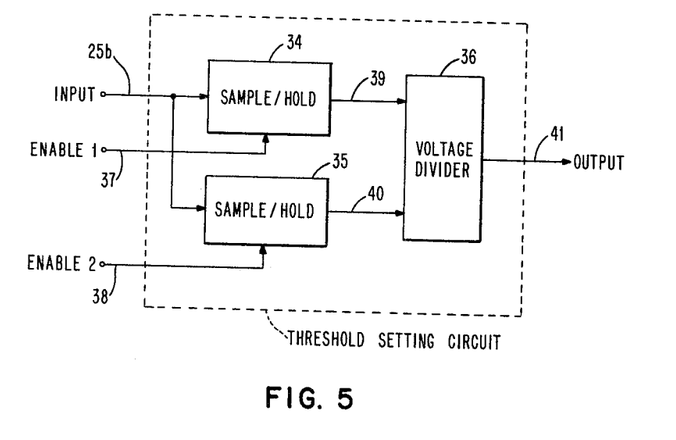
FIG. 5 schematically illustrates the threshold setting circuit used in the present invention.

Thus, for example, the glass will give rise to a one level of secondary electrons, usually low, while the patterns in the field will give rise to a different level, usually higher. Henceforth for convenience only, the detection of secondary electrons will be described even though the apparatus could utilize back-scattered electrons. The beam is now caused to scan across the selected field. As the beam traverses the field different levels of secondary electrons are created by the beam impinging on the glass and the patterns. These secondary electrons are detected by the detector 18 which produces a signal proportional to the number of secondary electrons detected. This signal is amplified by amplifier 19 and transmitted to the threshold setting circuit 20. This threshold setting circuit 20 is comprised of a pair of sample and hold circuits 34 and 35 and a voltage divider 36 as shown in FIG. 5.

The beam is first directed against the glass and an enable signal from the processor is sent via line 37 to the sample and hold circuit 34 to cause the sample and hold circuit 34 to turn on. After a predetermined time the enable signal to the sample and hold circuit 34 is shut off. The beam is then directed to a pattern area and a second enable signal is sent to sample and hold circuit 35 via line 38. This procedure is used to calibrate the detector threshold for a particular area of the mask.

The outputs of these sample and hold circuits are transferred to a voltage divider circuit 36 via line 39 and 40. The output of the voltage divider which is approximately one-half way between the two outputs of the sample and hold circuits is set into the comparator circuit 21 and acts as a threshold voltage against which signals on line 25a are to be compared. This threshold level is thus established dynamically and is based upon the average value of the different signal strengths created by the detected secondary electrons from both the glass areas, where the pattern is absent, and the areas where the patterns are present. This establishment of a threshold level becomes important especially when the return signal is noisy and subject to variations due to density variations, geometric defects or circuit drift. It may be desirable to have more than one threshold level for some applications.

This threshold level can be periodically adjusted to account for variations in beam current, or changes in the signal received because of variations in the target such as pattern thickness or density or the like.

If desired, the apparatus of FIG. 1 can be supplied with an optical microscope (not shown) and the mask can be roughly aligned by visual observation of the gross alignment marks 13a, 13b, 13c and 13d. Once the mask has been roughly aligned through use of the gross alignment marks, the information contained in the processor 24 is now used to activate the beam source 16 and move the table 10. Hence the mask moves a fixed known distance and direction so that the beam is located over the area of a selected one of said fields 14. The beam is now caused to traverse the selected field or sub-field.

Figure 6:
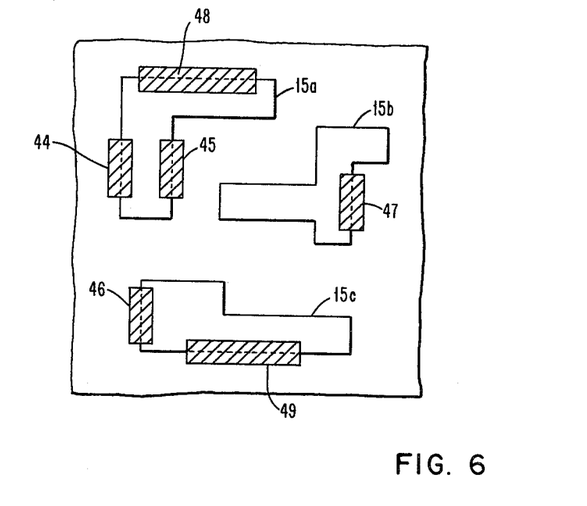
FIG. 6 illustrates a portion of the field of FIG. 3 being used for alignment.

Exact registration of each field to a final fixed predetermined inspection position is now accomplished by scanning selected ones of the patterns 15 in a sub-field or portion of the selected field 14. The preselected portion may be designed for alignment purposes only and repeated from field to field or it may be part of the field pattern itself and therefore, could be different for each unique field pattern. The actual patterns to be scanned for registration are determined off-line in the same process that specifies the complementary patterns to be used for performing the inspection. This precision registration may be accomplished using any preselected portion of the field. For example, as shown in FIG. 6 three distinct patterns 15a, 15b and 15c appearing in the upper left hand corner of the field 14 of FIG. 3 will be used and referred to as a sub-field in the following example. The switch 25 is now set to couple the proportioning circuit 22 to the detector 18 via line 25c and amplifier 19. The processor 24 via the controller 17 now causes the beam to scan portions of the selected edges of each of the patterns 15a, 15b and 15c in order to locate these patterns relative to a desired inspection position. Once the actual position of these selected patterns is determined the proportioning circuit 22, via sample and hold circuit 23 and line 23a imposes a position correction on the beam controller to cause the beam 28 to be adjusted in position such that, with respect to a moving position of the beam, the entire selected field will be in the desired inspection position.

By causing the beam to traverse a region overlapping an edge of the pattern and integrating the signal returning from this scan along the edge of the pattern and then reversing the signal polarity and then causing the beam to traverse an equal length scan on an opposite edge of a pattern and integrating this signal and summing these integrated signals an error term can be generated that represents the displacement of the image from the desired position to which the sub-field is to be aligned. This displacement is independent of the size error contributions. Thus a scan is for example, first performed on the left edge, i.e. the horizontal direction of pattern 15 as shown by the shaded area 44 of FIG. 6. This scan generates secondary electrons from both the pattern and the glass which are detected by detector 18 and the signal generated is fed into the proportioning circuit 22.

Figure 4:
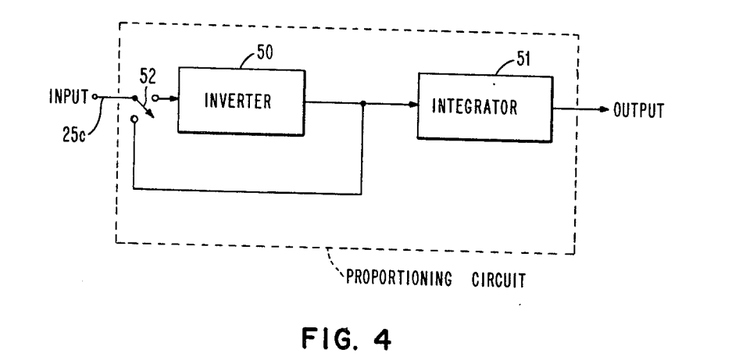
FIG. 4 schematically illustrates the proportioning circuit used in the present invention.

As shown in FIG. 4 the proportioning circuit is comprised of an inverter circuit 50, an integrator circuit 51 and a switch 52 controlled by the digital control processor 24 via line 22b. The closing of switch 52 removes the inverter circuit from the proportioning circuit.

Before scanning the area 44 the switch 52 is set to force the signal through the inverter 50. The beam is now activated to scan along the edge of the pattern 15a. The area scanned has a width W and a distance L, and is shown as the shaded area 44. The signal from this scan is picked up by the detector 18 and is fed via line 25c into the proportioning circuit. The inverter 50 inverts this input signal and applies it to the integrating circuit 51 whose output on line 22 is connected to the sample and hold circuit 23.

Figure 8:
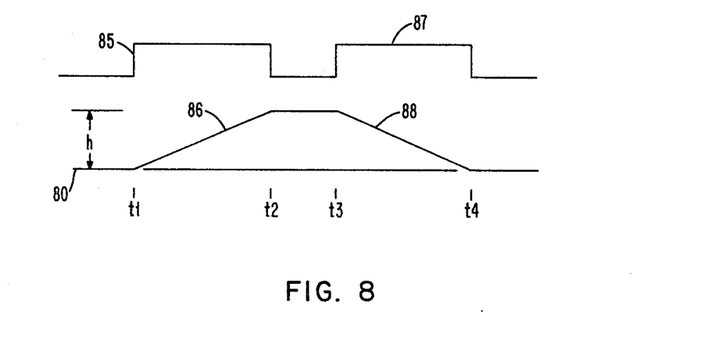
FIG. 8 illustrates the input and output signals of selected ones of the scans of FIG. 4.

As shown, in FIG. 8, the detector 18 provides to the line 25c a square wave 85 extending from time t1, to time t2. This square wave 85 is converted, by the proportioning circuit of FIG. 4 into a ramped voltage 86 which appears on line 22a. This ramp voltage 86 begins at time t1 and continues to rise from a base line 80 until the square wave input pulse 85 terminates at time t2. The height h to which the ramp 86 rises is proportional to the total number of secondary electrons emitted by the scanned area 44. A percentage of the secondary electrons detected by the detector 18 will be received from the glass and the remainder will be detected from the pattern material.

Once the scan of area 44 is complete the beam 28 is turned off and the proportioning circuit 22 is reset by changing switch 32. The beam is now stepped a distance to the right that is equal to the width of pattern 15*a* so that it now scans an area 45 along the right hand edge of pattern 15*a*. This area 45 also has a width W and a length L. Once again as the beam scans this area 45 the secondary electrons from the surface are detected by detector 18 and sent as square wave 87, time t3 to time t4, to the proportioning circuit at input 25*c*. However, in this case because the switch 52 is set to force the inverter 50 out of the circuit, the signal is passed around the inverter 50 to the integrator 51. The output of the proportioning circuit is indicated by the declining ramp 88. If as shown the ramp 88 returns to the base line 80 from whence it started means that the area 44 overlapped exactly the same amount of pattern 15*a* as did the area 45.

If the scans did not cover exactly the same amounts of pattern and conductive glass layer 53 the ramp voltages would not be equal and a return to the base line would not be realized and an indication of the amount of adjustment necessary to cause the subfield to become exactly registered to the desired or expected position would be indicated.

Figure 9:
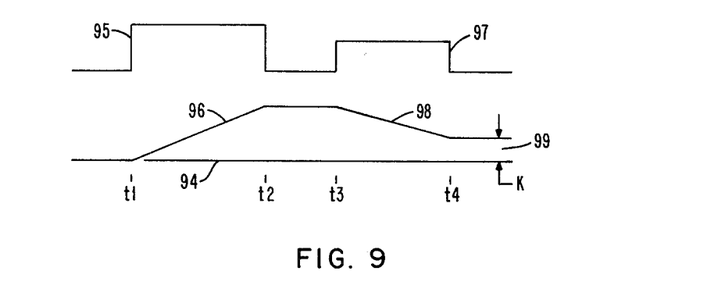
FIG. 9 illustrates the input and output signals of the scans of FIG. 10.

This will be best explained by reference to FIGS. 9 and 10.

Figure 10:
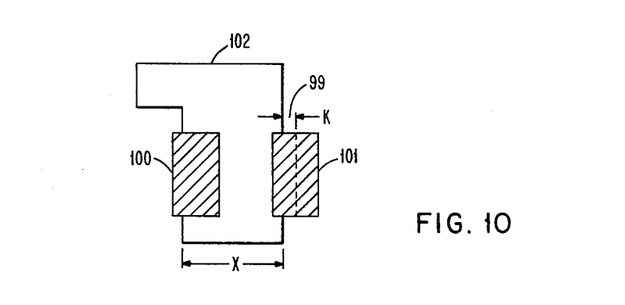
FIG. 10 illustrates offset scans on a selected circuit portion.

In FIG. 10, scans 100 and 101 are shown overlapping a pattern 102. As shown the area 100 overlies more of the pattern 102 than does the area 101. As shown in FIG. 9, the scanning of area 100 causes a square wave 95 extending from time t1 to time t2 which is translated by the proportioning circuit 22 into a ramp voltage 96 rising from a base line 94.

Because the area 100 covers more of the pattern the number of secondary electrons created by the beam scanning is quite high.

Again the beam is moved and the area 101 scanned. In this it should be noted that the height of the output square wave 97, time t3 to time t4, is lower than that of square wave 95 is indicative of the fact that a lesser amount of electrons is being received by the detector 18. Thus the ramp voltage 98 does not return to the base line but instead terminates at a height 99 above the base line. This height 99 is proportional to the displacement K of the edge of the pattern 102 from the center line of the scans. This displacement information can now be sent to the beam controller via line 23*a* to cause the beam to be adjusted to correct for this displacement. If desired the information could be sent to the processor 24 which then causes the controller to reset the beam.

By scanning first along the right edge and then along the left edge of the pattern 15*a* and then integrating the detected secondary electron signal that came from these scans the location of these scans with respect to the image pattern in the left-right dimension can be determined as above described. This process can, if desired, be repeated again using a different left hand scan 46 on pattern 15*c* and a right hand scan 47 on pattern 15*b*. Once the sub-field has been properly positioned in the left-right dimension it is scanned in the manner described above so as to position it in a top-bottom dimension. This is accomplished by first passing the beam over the area 48 positioned on the top of pattern 15*a* and then over the area 49 on the bottom of pattern 15*c* as shown in FIG. 6. Again these areas should have equal widths and equal lengths so that the signals derived from such scans are proportional to the amount of overlap of the scan on the patterns. Once these scans are completed the derived information is used by the beam controller 17 to position the scanned patterns up or down to the desired inspection position. Such exact sub-field registration minimizes the positional error between the scanning beam and the actual image and results in a very precise alignment of the field.

Once this field registration is concluded the entire field is now inspected. To begin the inspection step the switch 25 is reset to disconnect the proportioning circuit 22 and to connect the comparator 21 to the detector 18 and amplifier 19. A voltage level equal to the previously determined threshold level is applied to input 41 of the comparator circuit 21. The processor, which has stored therein a complete description of the patterns to be inspected, first causes the beam 28 to scan the patterns 15*a*, 15*b*, and 15*c* within the subfield being inspected. The beam spot is of fixed size and is stepped only over the areas in the subfield where the patterns are expected to be. The secondary electron current from each scanned pattern is monitored by comparator 21 which signals processor 24 any time the signal falls below the threshold level so the coordinates of the beam at that time are recorded to indicate a "missing-pattern" defect. Once each of the patterns 15*a*, 15*b*, etc, are all scanned the beam is directed to be stepped over only the areas where no pattern or pattern-like material is expected to be. Again the secondary electron current is monitored, and the processor 24 is signalled any time that the current rises above the threshold level. The coordinates of the beam are again recorded to indicate an "additive defect", i.e. in this instance it indicates that pattern like material exists on areas that it should be clear of such material.

The described system can detect defects in the order of 1.0 micron diameter when an electron spot having an area of approximately $(1.5 \text{ microns})^2$ is used and the beam scan overlaps the previous scan by 0.75 to 1 micron in each axes. The use of overlapping beam scans assures that no defect will be missed. The use of a spot that is comparable to the size of the defect to be detected enhances the thruput of the system and avoids the necessity of sophisticated pattern recognition hardware or software which would be necessary if a smaller spot were used. Overlap assures detection of minimum size defects without substantial falsealarm rate.

As each sub-field is registered and scanned as described the defects are recorded and their position noted. Additionally, the invention teaches that by using a spot comparable to the size of the minimum defect to be detected and by overlapping the spots every defect above the minimum will be detected. Use of a large spot and overlapping scan results in some advantages. For example, a signal from an inspection spot is usually larger and easier to detect as its size increases and the larger the spot the faster the inspection proceeds. Additionally, detection of a single spot where the return signal is abnormal is proof of a defect without requiring the recognition of grouping of defect information which would consequently increase the complexity of signal handling and require analysis.

It should be noted that each sub-field is inspected by stepping the beam first over all areas which are supposed to have patterns while monitoring the signal for absence of the pattern and then over the remaining areas, i.e. complement of the expected image while monitoring for the presence of unwanted patterns or pattern like material.

Figure 7:
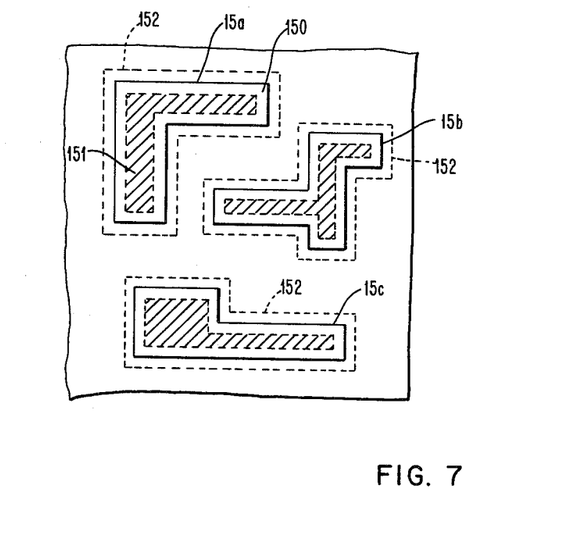
FIG. 7 illustrates the sub-field of FIG. 6 showing the boundaries of the positive and negative image as measured by the invention during the error inspection step of the invention.

As indicated in FIG. 7 it is desirable that a slight border area be left unscanned by the electron beam around each scanned pattern 15a, 15b, and 15c. Thus, in FIG. 7, a border region 150 bounded by dotted lines 151 and 152, is shown around pattern 15a overlies at the edge of the scanned metal pattern 15a but also a region around and contiguous to the pattern 15a. Thus, the scan of pattern 15a is indicated by the cross hatched area within dotted line 151 and the scan of the surrounding area lies outside the dotted line 152.

Note that each sub-field is scanned three times:

First with a deflection over edges of the expected pattern in the sub-field to allow immediate sub-field registration.

Next with a deflection over all areas of the sub-field from which one signal level is expected.

Finally with a deflection over all areas of the sub-field from which another signal level is expected. The last two scans are essentially complementary within each sub-field but are different from one sub-field to the next. All three deflection patterns are defined off-line based on a description of what patterns should exist on the workpiece to be inspected, normally using the numerical data table which directed the fabrication of the workpiece originally.

Note also that the scanning of the complementary sub-field areas is done with a sequence of individual rectangular, usually square, spots of uniform illumination, the coordinates of each illuminating spot being known, so that when a deviation from the expected return signal is encountered, the coordinates of the defective area are known and can be recorded for subsequent repair. The use of rectangular non-overlapping spots is well known in the literature as a method of high speed pattern exposure. The use of relatively large overlapping rectangular spots is advantageous in giving high throughput, high assurance of detecting significant defects, low probability of producing false alarms, and adequate levels of return signal.

Once the sub-field is inspected the beam is positioned over the next sub-field to be inspected and the process described above repeated until the entire field 14 has been inspected.

The invention teaches a novel concept of inspecting masks.

It should be clearly understood that the invention can be used with many other mask or pattern materials and can employ means other than electron beams for inspection. Thus, optical, infrared, x-ray or the like could be used. Also the mask could be transmissive instead of reflective. Still further it should be understood that the insepction equipment may require or use a form of radiation which would be different from the radiation employed when using the mask for exposure purposes. Thus, for example reflective electron beams can be used for inspection while a transmissive optical beam would be used for exposure purposes.

While the invention has been particularly described with reference to the preferred embodiment thereof it will be understood by those skilled in the art that the foregoing and other changes in form and details be made therein without departing from the spirit and scope of the invention.

What is claimed is:

1. A method of positioning and inspecting a patterned workpiece comprising the steps of:
   placing a patterned workpiece, provided with a multiplicity of patterns, to be inspected in an inspection apparatus,
   directing a beam to scan a selected region overlying a first edge of a selected first pattern of said multiplicity of patterns on said workpiece,
   measuring and storing the signal created by the beam scanning said region,
   directing the beam to scan a second selected region overlying a second edge of said first pattern,
   said second edge being substantially parallel to said first edge,
   measuring and storing the signal created by the beam scanning said second region,
   directing the beam to scan a third selected region overlying a third edge of said first pattern,
   said third edge being at an angle with respect to said first and second edges,
   measuring and storing the signal created by the beam scanning said third region,
   directing the beam to scan a fourth selected region overlying a fourth edge of said first pattern,
   said fourth edge being substantially parallel to said third edge,
   measuring and storing the signal created by the beam scanning said fourth region, and
   using said measured signals from said first, second, third and fourth regions to align the scanned edges of said first pattern to a predetermined inspection position,
   directing the beam to scan over the entire said first pattern, measuring the signals created by the beam scanning said first pattern, and comparing the measured signals from said first pattern to the information used to create the patterned workpiece to detect defects in said pattern, and
   directing the beam to scan the area surrounding said first pattern and comparing the measured signal from the area surrounding said one pattern to the information used to create the patterned workpiece to detect defects outside of said first pattern.

2. The method of claim 1 wherein said beam is an optical beam.

3. The method of claim 1 wherein said beam is an electron beam.

4. The method of claim 1 wherein said workpiece is comprised of a substrate and said patterns are formed of films thereon and said beam is selected so that said substrate is transparent to said beam.

5. The method of claim 4 wherein said films are opaque to said beam.

6. The method of claim 3 wherein said workpiece comprises a substrate on which film patterns are deposited,
   said layer and said film patterns having different reflective characteristics when impinged upon by said beam, and
   said measured signals are in the form of reflected beams from said scanned regions.

7. A method of inspecting metallized, patterned glass masks comprising the steps of:
   placing a glass mask, having a plurality of replicated fields thereon, each field comprising metallized and unmetallized surface portions, on a table positionable in a plane normal with respect to the nominal position of an electron beam, aligning said mask to a first position with respect to said nominal position using gross alignment marks on said mask, exposing a metallized portion of one of said fields to said electron beam and measuring the back-scattered electron current from said metallized portion generated by the beam impinging on said metallized portion, exposing an unmetallized portion of said one of said fields to said beam and measuring the back-scattered electron current from said unmetallized portion generated by the beam impinging on said unmetallized portion, establishing a threshold level between the measured currents, traversing, a first region overlapping a first edge of a selected metallized pattern in said one of said fields with said beam and measuring the back-scattered electron current from said region, moving said beam with respect to said mask an amount equal to the pre-established width of said selected metallized pattern, traversing a second region overlapping a second edge of said selected metallized pattern, said second edge being parallel to said first edge, with said beam and measuring the back-scattered electron current from said region, comparing the measured current from the first region with the measured current from the second region, determining the difference between the measured currents, positioning said table to resposition said beam with respect to said pattern to eliminate the difference between said measured currents and to compensate for positional error of said beam in said first position with respect to said pattern, repeating said travserving, moving comparing, and determining steps on parallel edges of said pattern at an angle with respect to said first and second edges, repositioning said table to a third position to compensate for positional error of said beam in said second position with respect to said pattern, and traversing said beam over the said selected pattern, measuring the back-scattered current from said pattern, and comparing said current with a predetermined level to detect defects in said pattern directing the beam to the unmetallized portion of said mask surrounding said selected metallized pattern, and observing the returned signal for a change in level indicative of a defect in said unmetallized portion.

8. The method of claim 7 further comprising the step of:

adjusting the beam into a probe size to be substantially similar to the size of the defect to be detected.

9. The method of claim 8 further comprising the step of:

stepping said beam probe over said pattern in overlapping scans so that minimum size defects will substantially coincide with the beam probe.

10. Apparatus for positioning and inspecting a glass mask having metal patterns thereon comprising:

a table for supporting a glass mask having deposits of metal patterns thereon, beam means positioned above the table for directing a beam onto a glass mask positioned on the table, detection means for detecting electrons from said glass mask when said electron beam impinges on said mask, circuit means coupled to said detection means for measuring the electron current from said mask, processor means coupled to said circuit means for analyzing said measured electron current to control the position of the mask to a predetermined inspection position with respect to said beam and for detecting errors in the metal patterns on said mask and controller means, coupling between the electron beam means and the processor means and the circuit means, for controlling the starting, stopping and position of the beam, said circuit means including a threshold setting circuit for establishing a level for distinguishing back-scattered electron current from different materials coupled between said detector means and said processor means, and a proportioning circuit for measuring differences in generated currents from selectively scanned regions coupled between said controller means and said detector means, and a comparator circuit coupled between said detector means and said processor means, and to said threshold circuit.

11. The apparatus of claim 10 wherein said proportioning circuit is further coupled to said processor means.

12. The appartus of claim 10 wherein said proportioning circuit further includes an inverter circuit and an integrator circuit in series with said inverter circuit.

13. The apparatus of claim 10 wherein said threshold setting circuit further includes a pair of parallel sample and hold circuits whose outputs are coupled to a voltage divider circuit.

* * * * *